(12) United States Patent
Kusano et al.

(10) Patent No.: US 11,183,374 B2
(45) Date of Patent: Nov. 23, 2021

(54) WASTAGE DETERMINATION METHOD AND PLASMA PROCESSING APPARATUS

(71) Applicant: Tokyo Electron Limited, Tokyo (JP)

(72) Inventors: Shu Kusano, Miyagi (JP); Yusuke Hirayama, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/935,418

(22) Filed: Jul. 22, 2020

(65) Prior Publication Data

US 2020/0350148 A1 Nov. 5, 2020

Related U.S. Application Data

(63) Continuation of application No. 16/472,339, filed as application No. PCT/JP2017/044933 on Dec. 14, 2017, now Pat. No. 10,763,089.

(30) Foreign Application Priority Data

Dec. 26, 2016 (JP) ................. 2016-251571

(51) Int. Cl.
*H01J 37/32* (2006.01)
*G01N 15/06* (2006.01)
*B08B 7/00* (2006.01)

(52) U.S. Cl.
CPC ........ *H01J 37/32889* (2013.01); *G01N 15/06* (2013.01); *B08B 7/0035* (2013.01); *G01N 2015/0693* (2013.01); *H01J 2237/335* (2013.01)

(58) Field of Classification Search
CPC .......... H01J 37/32889; H01J 2237/335; G01N 15/06; G01N 2015/0693; B08B 7/0035
See application file for complete search history.

(56) References Cited

U.S. PATENT DOCUMENTS 7,202,946 B2 * 4/2007 Powell ...................... G01J 3/02
356/316

FOREIGN PATENT DOCUMENTS

JP 2011-108816 6/2011
JP 2016-028448 2/2016

\* cited by examiner

*Primary Examiner* — Jamil Ahmed
(74) *Attorney, Agent, or Firm* — IPUSA, PLLC (57) ABSTRACT

There is provision of a plasma processing apparatus including a chamber; a gas inlet for supplying a first gas containing fluorine and supplying a second gas into the chamber; a plasma generator configured to generate a plasma from the first gas and the second gas supplied into the chamber; an optical emission spectrometer (OES) configured to measure light emission intensities of first radicals and second radicals in the plasma, the first radicals originating from the first gas, the second radicals originating from the second gas; an expendable part disposed in the chamber; and a processor configured to determine a wastage rate of the expendable part based on the measured light emission intensities of the first radicals and the second radicals.

16 Claims, 8 Drawing Sheets

WASTAGE DETERMINATION METHOD AND PLASMA PROCESSING APPARATUS

CROSS-REFERENCE TO RELATED APPLICATIONS

The present application is a continuation of patent application Ser. No. 16/472,339 filed on Jun. 21, 2019, which is a national stage application, filed under 35 U.S.C. § 371, of International Patent Application No. PCT/JP2017/044933 filed on Dec. 14, 2017, which claims priority under 35 U.S.C. § 119 to Japanese Patent Application No. 2016-251571 filed on Dec. 26, 2016, the contents of which are incorporated herein by reference in their entirety.

TECHNICAL FIELD

The present invention generally relates to a wastage determination method and a plasma processing apparatus.

BACKGROUND

In a plasma processing apparatus, a member in the processing chamber is damaged by plasma. An example of damage by plasma includes wastage of a member (a surface facing plasma or a gap) used in a processing chamber. A reaction product deposited in the processing chamber during plasma processing of the wafer is cleaned and removed by dry cleaning or waferless dry cleaning (WLDC).

Waferless dry cleaning is a process of removing deposit by plasma richly containing oxygen (O) radicals or fluorine (F) radicals, without placing a wafer on a stage. The waferless dry cleaning is repeated during between wafer processes. At this time, not only a surface of the stage, but also an adhesive used in components of the stage is abraded. When wastage amount of an adhesive used in the stage increases, thermal resistance of an abraded portion increases, and thereby local temperature increase of the wafer located near the abraded portion occurs.

As a method of preventing wastage of an adhesive, it has been proposed that labyrinth processing or the like is applied so that an adhesive surface is not visible (see Japanese Laid-open Patent Application Publication No. 2011-108816, for example). It has also been proposed to cover portions exposed to plasma with material that are more plasma resistant (see Japanese Laid-open Patent Application Publication No. 2016-028448, for example).

However, even if labyrinth processing were applied or a portion exposed to plasma were covered, radicals or ions in the plasma would enter through a small gap, and abrade the adhesive. In addition, a degree of wastage of an adhesive varies depending on, for example, magnitude of applied radio frequency electric power, and types of adhesives. Accordingly, it is difficult to determine the degree of wastage of a particular expendable part in the conventional art.

SUMMARY

In order to solve the above-described problem, according to one aspect, there is provision of a plasma processing apparatus including a chamber; a gas inlet for supplying a first gas containing fluorine and supplying a second gas into the chamber; a plasma generator configured to generate a plasma from the first gas and the second gas supplied into the chamber; an optical emission spectrometer (OES) configured to measure light emission intensities of first radicals and second radicals in the plasma, the first radicals originating from the first gas, the second radicals originating from the second gas; an expendable part disposed in the chamber; and a processor configured to determine a wastage rate of the expendable part based on the measured light emission intensities of the first radicals and the second radicals.

DESCRIPTION OF EMBODIMENTS

In the following, embodiments of the present invention will be described with reference to the drawings. Note that in the following descriptions and the drawings, elements having substantially identical features are given the same reference symbols and overlapping descriptions may be omitted.

[Overall Configuration of Plasma Processing Apparatus]

First, an entire configuration of a plasma processing apparatus 1 according to an embodiment of the present invention will be described with reference to an example of a longitudinal sectional view of a plasma processing apparatus in FIG. 1. In the present embodiment, an example of a plasma processing apparatus 1 is a capacitively coupled plasma etching apparatus.

The plasma processing apparatus 1 according to the present embodiment is a device that performs plasma processing such as, but not limited to, atomic layer etching (ALE), reactive ion etching (RIE), and asking, to a semiconductor wafer W (hereinafter referred to as a "wafer W").

The plasma processing apparatus 1 includes a processing vessel (chamber) 10 made from conductive material such as aluminum, and a gas supply source 15 for supplying gas into the processing vessel 10. The interior of the processing vessel 10 is a processing chamber in which a predetermined plasma process is applied to a wafer W. The gas supply source 15 supplies an etching gas when etching is performed, and supplies a cleaning gas when cleaning is performed.

The processing vessel 10 is electrically grounded. In the processing vessel 10, a lower electrode 20 and an upper electrode 25 arranged in parallel with the lower electrode 20 are provided. The lower electrode 20 also serves as a stage on which a wafer W is placed. The lower electrode 20 is connected to a first high frequency power supply 32 that provides high frequency power HF for plasma generation at a first frequency, and to a second high frequency power supply 34 that provides high frequency power LF for attracting ions at a second frequency lower than the first frequency. However, the first high frequency power supply 32 may provide high frequency power HF to at least one of the lower electrode 20 and the upper electrode 25.

The first high frequency power supply 32 is connected to the lower electrode 20 via a first matching unit 33. The second high frequency power supply 34 is connected to the lower electrode 20 via a second matching unit 35. The first and second matching units 33 and 35, respectively, are for matching the load impedance to the internal (or output) impedance of the first and second high frequency power supplies 32 and 34. While a plasma is generated in the processing vessel 10, the first and second matching units 33 and 35 function such that the internal impedance of the first high frequency power supply 32 and the internal impedance of the second high frequency power supply 34 apparently coincide with the corresponding load impedance.

The upper electrode 25 is attached to a ceiling of the processing vessel 10 via a shield ring 40 covering a periphery of the upper electrode 25. A diffusion chamber 50 is provided in the upper electrode 25. The diffusion chamber 50 diffuses gas introduced from the gas supply source 15. A gas inlet 45 is provided to the diffusion chamber 50, and through the gas inlet 45, various gases can be introduced from the gas supply source 15 into the diffusion chamber 50. The upper electrode 25 is provided with a large number of gas flow paths 55 for supplying gas from the diffusion chamber 50 to the processing vessel 10.

Figure 1:
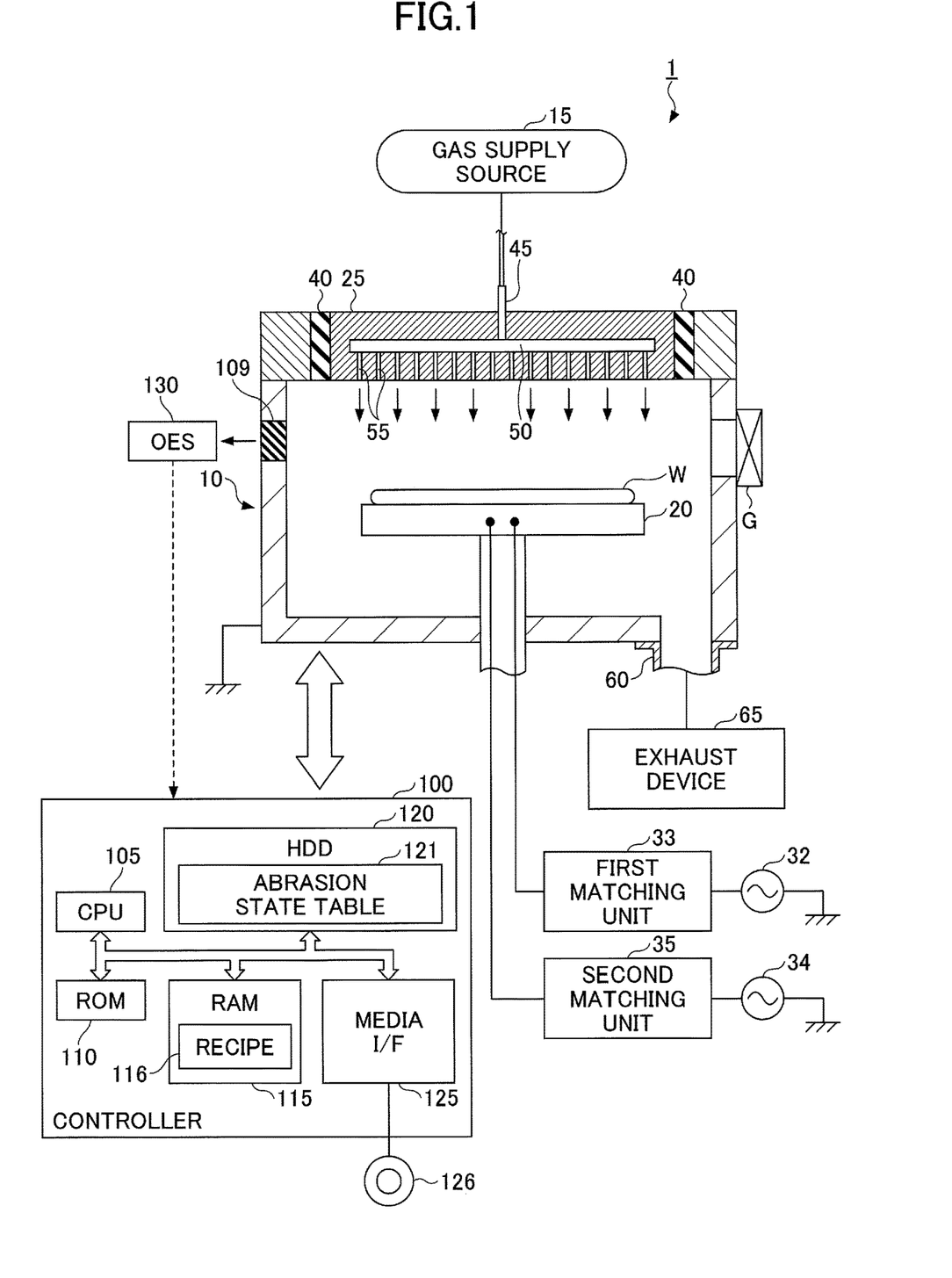
FIG. 1 is a diagram illustrating an example of a plasma processing apparatus according to an embodiment.

The gas output from the gas supply source 15 is first distributed to the diffusion chamber 50 through the gas inlet 45 illustrated in FIG. 1. The gas supplied to the diffusion chamber 50 is then supplied into the processing vessel 10 through the gas flow paths 55. The upper electrode 25 according to the above-described configuration also serves as a gas showerhead for supplying gas.

An exhaust port 60 is formed on a bottom surface of the processing vessel 10, and the inside of the processing vessel 10 is evacuated by an exhaust device 65 connected to the exhaust port 60. This allows the processing vessel 10 to be maintained at a predetermined quality of vacuum.

A gate valve G is provided on a side wall of the processing vessel 10. The gate valve G opens and closes a loading/unloading port when loading/unloading a wafer W to/from the processing vessel 10.

The plasma processing apparatus 1 is provided with a controller 100 for controlling an entire operation of the apparatus. The controller 100 includes a CPU (Central Processing Unit) 105, a ROM (Read Only Memory) 110, a RAM (Random Access Memory) 115, an HDD (Hard Drive Disk) 120, and a media I/F (interface) 125. A recipe 116 is stored in the RAM 115. The recipe 116 includes control information of the plasma processing apparatus 1 corresponding to a process condition. The control information includes information about a process time, a switching time, pressure (gas exhaust), high frequency electric power and voltage, flow rates of various gases, a temperature in the chamber (e.g., upper electrode temperature, temperature at a side wall of the chamber, ESC temperature), and the like. The recipe 116 may be stored in a hard disk or a semiconductor memory. The recipe 116 may also be loaded in a memory such as the RAM 115, via the media I/F 125, from a state in which the recipe 116 is stored in a portable computer-readable recording medium 126 such as a CD-ROM or a DVD.

The CPU 105 controls plasma processing according to a procedure of the recipe 116 stored in the RAM 115. The CPU 105 determines a degree of wastage of a particular expendable part based on a wastage rate stored in a wastage state table 121 in the HDD 120. The wastage state table 121 is an example of a storage section in which light emission intensity of multiple gases including fluorine-based gas is stored in association with a wastage rate of a particular expendable part.

In the present embodiment, a measurement device of OES (Optical Emission Spectroscopy) 130 (such as an optical emission spectrometer, which may also be referred to as an "OES 130") can obtain light emission intensity of fluorine radicals and light emission intensity of oxygen radicals in the processing chamber. The wastage rate stored in the wastage state table 121 is calculated by substituting the obtained light emission intensity of fluorine radicals and the obtained light emission intensity of the oxygen radicals into Equation (1).

The plasma processing apparatus 1 is equipped with the OES 130 that is capable of measuring light emission intensity of various types of radicals in the processing vessel 10 through a quartz window 109. Light emitted by the various types of radicals in a plasma generated in the processing vessel 10 is received by the OES 130 through the quartz window 109.

By substituting the light emission intensity of the fluorine radicals in the plasma and the light emission intensity of the oxygen radicals in the plasma, which are detected by the OES 130, into Equation (1), the wastage rate is calculated.

$$V = A \times Io + B \times If + C \times Io \times If \qquad (1)$$

where V is a wastage rate of a particular expendable part, Io is light emission intensity of oxygen radicals, If is light emission intensity of fluorine radicals, and A, B, and C are coefficients.

A, B, and C have been learned in advance based on light emission intensity Io of oxygen radicals obtained from the OES 130, light emission intensity If of fluorine radicals obtained from the OES 130, and an observed wastage rate V. As described above, the wastage state table 121 storing values as defined by Equation (1) (light emission intensity Io of oxygen radicals, light emission intensity If of fluorine radicals, and a wastage rate V of a particular expendable part) in association with each other, is preset for each expendable part, and stored in a storage unit such as the RAM 115.

The controller 100 calculates a wastage rate of a particular expendable part based on the wastage state table 121 stored in the RAM 115 and the obtained light emission intensity of fluorine radicals and oxygen radicals, and uses the wastage rate to determine degree of wastage of the particular expendable part.

[Expendable Part: Adhesive]

Figure 2:
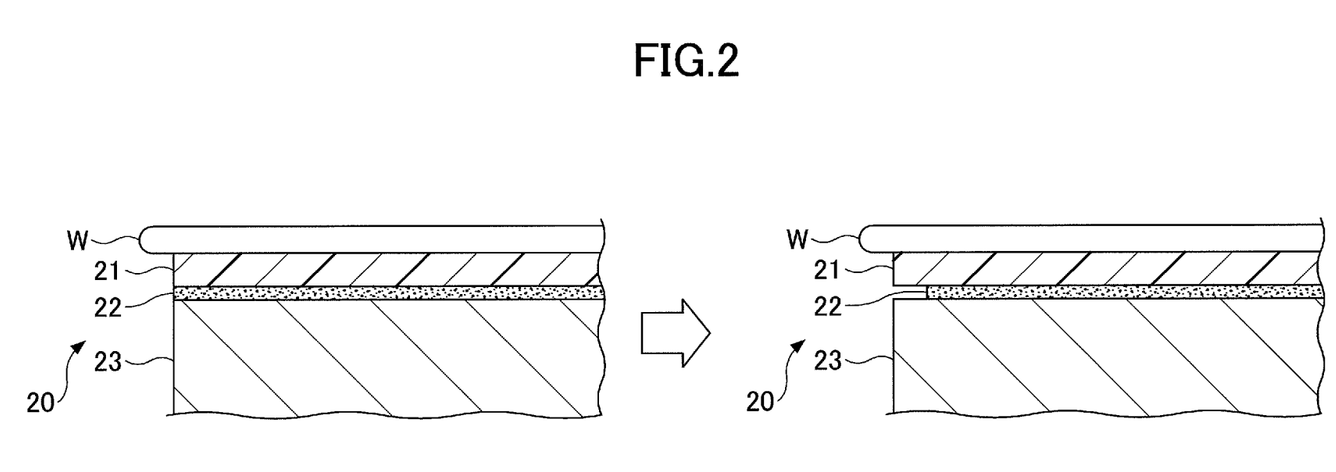
FIG. 2 is a diagram illustrating an example of wastage of an adhesive according to the embodiment.

The present embodiment describes a case in which a particular expendable part is an adhesive used in the processing chamber of the plasma processing apparatus 1. For example, as illustrated in FIG. 2, a ceramic member 21 of an electrostatic chuck that electrostatically attracts the wafer W is disposed on a metal base member 23 of the stage 20, and is bonded to the base member 23 with an adhesive 22. The adhesive 22 is an example of a particular expendable part used in the plasma processing apparatus 1. The adhesive 22 may be any one of acrylic material, epoxy resinous material, and silicon based material, and the material is selected considering thermal conductivity or plasma durability.

An example of a state of the adhesive 22 before being eroded by the plasma is illustrated on the left side of FIG. 2. In plasma processing, such as etching and deposition, waferless dry cleaning is performed between processes applied to a wafer to remove reaction products and other deposits generated during various processes.

In this case, the adhesive 22 is eroded and abraded by the plasma entering from a small gap at the side of the stage 20. Processing on an order of tens to hundreds of wafers does not cause problems, but if plasma processing is carried out for a longer period of time, the adhesive 22 between the ceramic member 21 of the electrostatic chuck and the base member 23 is abraded, and a gap is formed as illustrated on the right side of FIG. 2. As a result, because thermal resistance increases at the gap portion, problems such as local temperature increase of the wafer W occur.

However, a degree of wastage of the adhesive that is used in the interior of the plasma processing apparatus 1 is not known unless, for example, a cross section of a member, such as the ceramic member 21 of the electrostatic chuck, is inspected by breaking the member. In the wastage determination method according to the present embodiment, a wastage rate of a particular expendable part in the processing chamber, in which the plasma processing is performed, is calculated without breaking members, and a degree of wastage of the expendable part is determined by using the calculated wastage rate.

In particular, in the present embodiment, it is possible to estimate what adhesive is eroded by which reactive gas and how the adhesive is abraded, from the wastage rate calculated by Equation (1). Accordingly, a wastage amount of the adhesive 22 can be visualized from the wastage rate, without breaking the ceramic member 21 of the electrostatic chuck and inspecting the cross section of the adhesive 22. Thus, a degree of wastage of the adhesive 22 can be determined.

In the present embodiment, the adhesive 22 for fixing the ceramic member 21 is described as an example of a particular expendable part, but a particular expendable part is not limited thereto. A particular expendable part may be an adhesive used in the processing chamber of the plasma processing apparatus. Other examples include an adhesive used for sleeves, to protect a sidewall of a through-hole for heat transfer gas that is provided in the ceramic member 21, and to protect a sidewall of a through-hole for pins lifting the wafer. A particular expendable part may be a member other than an adhesive, which is abraded by a plasma.

As thermal resistance increases at the gap, which is formed by the adhesive 22 on the outer circumferential side of the stage 20 being lost as illustrated on the right side of FIG. 2, a temperature of a wafer W increases locally during plasma processing. This will be described with reference to FIG. 3, which illustrates an example of experimental results about a relationship between wastage and temperature increase.

Figure 3:
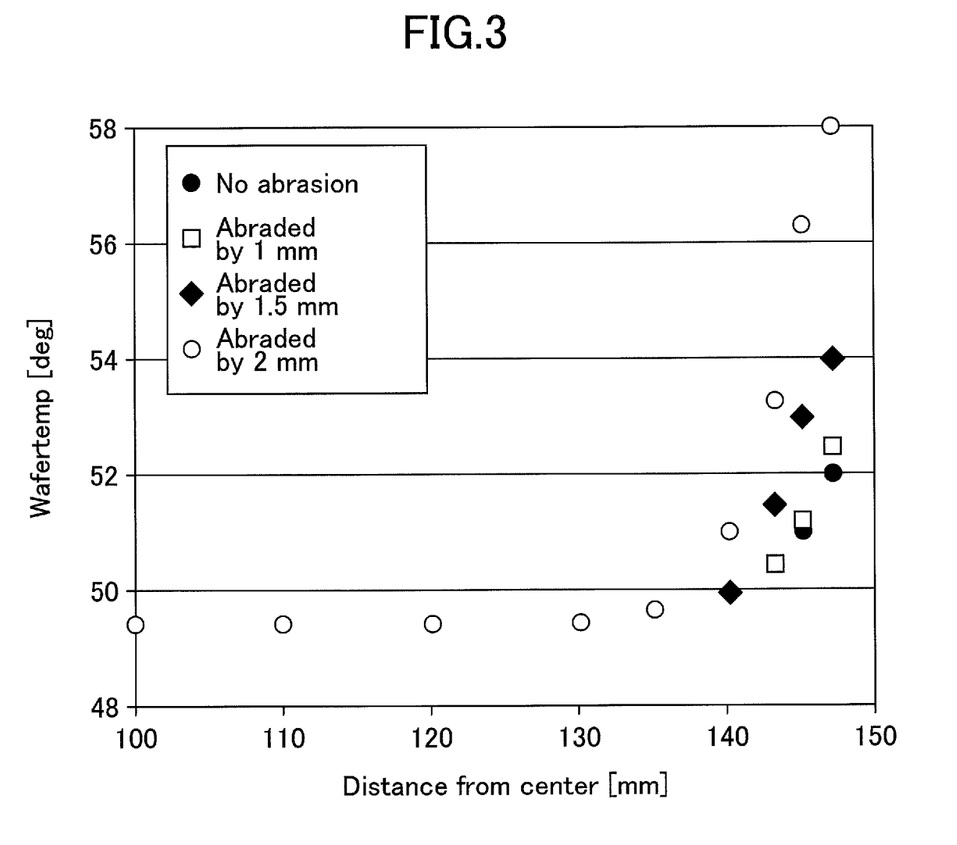
FIG. 3 is a diagram illustrating an example of temperature increase of a wafer edge portion due to wastage of an adhesive according to the embodiment.

The horizontal axis of FIG. 3 indicates a distance from the center of a wafer W of 300 mm in diameter, that is, the center of the wafer W corresponds to 0. The vertical axis indicates a temperature of the wafer W at a location indicated by the horizontal axis. Specifically, FIG. 3 represents an example of a result of plotting temperature distribution on an edge portion of a wafer (an area on the wafer W away from the center by 100 mm to 150 mm) for each wastage condition of the adhesive 22, when the wafer W is plasma processed under the same process condition.

According to the result of FIG. 3, in a case in which the adhesive 22 is abraded by 1.0 mm, no local temperature increase of the wafer W occurred at the edge portion of the wafer. However, in a case in which the adhesive 22 is abraded by 1.5 mm, the temperature at the edge portion of the wafer increased. In a case in which an amount of wastage of the adhesive 22 is 2.0 mm, the temperature increased by 5° C. or larger as compared to a case in which the adhesive 22 is not abraded. If the temperature changes greatly and temperature distribution becomes uneven at the edge portion of the wafer W, a yield rate of a product decreases because, for example, the controllability of an etching rate degrades and processing accuracy of the wafer W degrades. Considering the above results, it is preferable to replace the electrostatic chuck when an amount of wastage of the adhesive 22 reaches 1.5 mm, as a criterion.

The above-described phenomenon of local temperature increase at the edge of the wafer W caused by wastage of an adhesive mainly depends on types of gases used in waferless dry cleaning. Specifically, in a case in which oxygen plasma is used, little local temperature increase occurs. In contrast, in a case in which fluorine-based gas is added to a gas used for waferless dry cleaning, it is empirically known that the wastage rate drastically increases and that the phenomenon of local temperature increase occurs.

Figure 4:
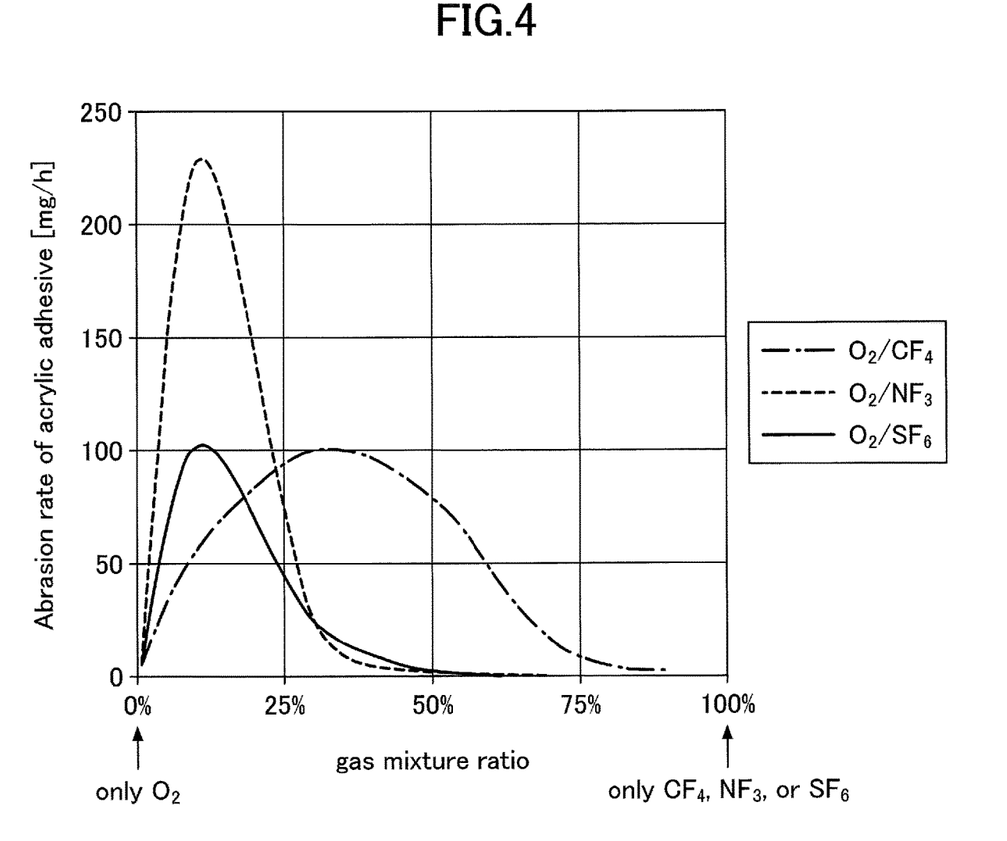
FIG. 4 illustrates an example of a wastage rate of an adhesive according to the embodiment.

Accordingly, a relationship between each gas and wastage of an adhesive was evaluated and stored in the wastage state table 121. FIG. 4 illustrates an example of rates of wastage of an acrylic adhesive, which is commonly used for adhesion in the plasma processing apparatus 1, caused by $CF_4$ (methane tetrafluoride) gas, $NF_3$ (nitrogen trifluoride) gas, and $SF_6$ (sulfur hexafluoride) gas.

[Wastage Rate]

The horizontal axis of FIG. 4 indicates a mixture ratio between $O_2$ (oxygen) gas and one of $CF_4$ gas, $NF_3$ gas, and $SF_6$ gas. A mixture ratio of 0% represents that a content ratio of $O_2$ gas is 100% (i.e., single gas of $O_2$ gas), and a mixture ratio of 100% represents that a content ratio of $CF_4$ gas, $NF_3$ gas, or $SF_6$ gas is 100% (i.e., single gas of $CF_4$ gas, $NF_3$ gas, or $SF_6$ gas).

In a gas at a mixture ratio of 25%, 75% of the gas is $O_2$ gas, and 25% of the gas is $CF_4$ gas, $NF_3$ gas, or $SF_6$ gas. In a gas at a mixture ratio of 50%, 50% of the gas is $O_2$ gas, and 50% of the gas is $CF_4$ gas, $NF_3$ gas, or $SF_6$ gas.

The vertical axis of FIG. 4 indicates a wastage rate of the acrylic adhesive. According to FIG. 4, in a case in which the gas mixture ratio is 100%, i.e., in a case of a single gas from among $CF_4$ gas, $NF_3$ gas, and $SF_6$ gas, the wastage rate is almost close to zero. In other words, it can be seen that the acrylic adhesive is hardly abraded in a case of a single gas from among $CF_4$ gas, $NF_3$ gas, and $SF_6$ gas.

On the other hand, if the gas mixture ratio is greater than 0% and less than 75%, it can be seen that the acrylic adhesive is abraded. In particular, with respect to $NF_3$ and $SF_6$ gases, the wastage rate of the acrylic adhesive is high at a gas mixture ratio of 25% or less. Also, with respect to $CF_4$ gas, the wastage rate of the acrylic adhesive is high at a gas mixture ratio of 50% or less.

From the above results, it has been found that, by adding any one of $CF_4$ gas, $NF_3$ gas, and $SF_6$ gas to a cleaning gas, a wastage rate of the adhesive increases. Note that, this wastage rate tendency has been confirmed such that the trend of these wastage amounts cannot be explained by an etching rate of a photoresist or oxide film under various conditions.

Thus, in the wastage determination method according to the present embodiment, attention is paid to fluorine radicals (F*) and oxygen radicals (O*), which are types of gas used in waferless dry cleaning. Specifically, light emission intensity is measured for each of the radicals, and a wastage rate is calculated from the measured result. The wastage rate is calculated by Equation (1) described above.

Figure 5:
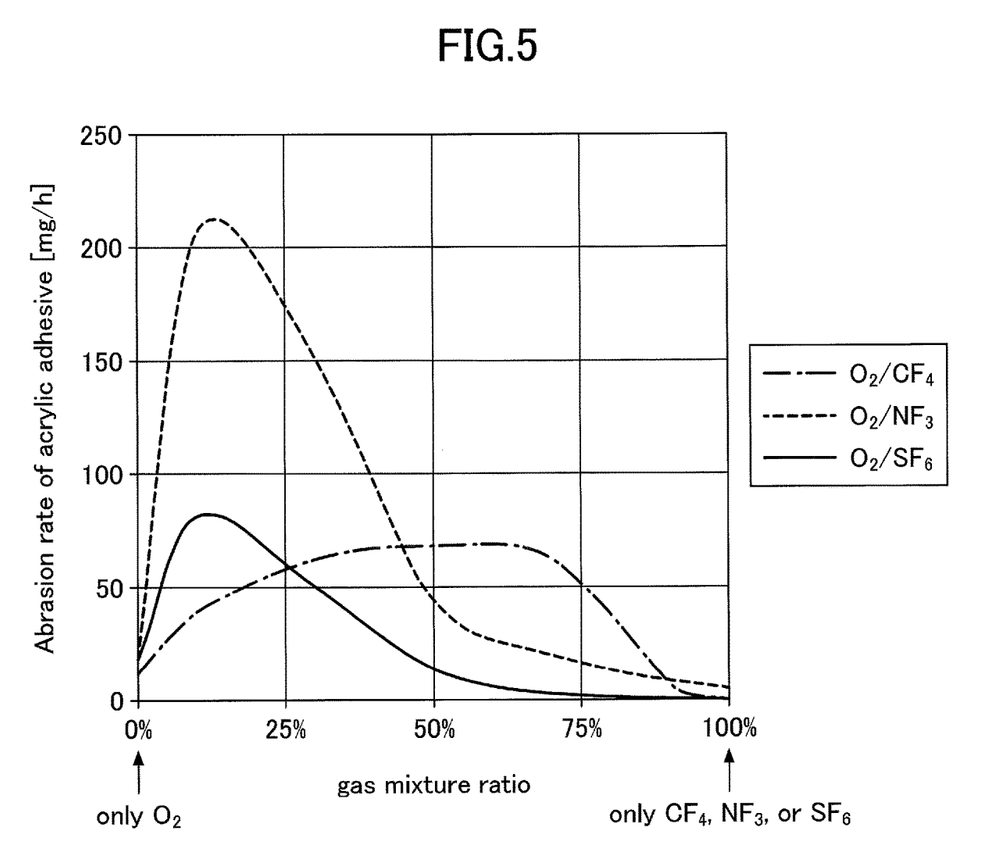
FIG. 5 is a diagram illustrating an example of a table of a wastage rate calculated using OES according to the embodiment.

FIG. 5 is a graph illustrating an example of a wastage rate of an adhesive calculated by substituting, into Equation (1), the light emission intensity Io of the oxygen radicals and the light emission intensity If of the fluorine radicals that are obtained by the OES 130. As can be seen from FIG. 5, the graph of FIG. 5 plotting the wastage rate of the adhesive calculated from Equation (1) is close to the graph of FIG. 4 plotting the wastage rate of the adhesive actually measured. That is, it is found that an amount of wastage of the adhesive 22 caused by a process using multiple gases including fluorine-based gas (e.g., waferless dry cleaning) can be predicted, based on a wastage rate calculated by substituting, into Equation (1), the light emission intensity Io of the oxygen radicals and the light emission intensity If of the fluorine radicals that are detected by the OES 130.

Accordingly, in the present embodiment, an amount of wastage is calculated based on the wastage rate of a specific expendable part calculated from light emitting intensity detected by the OES 130 and Equation (1), and a degree of wastage of the specific expendable part is determined based on the calculated amount of wastage.

[Amount of Wastage]

A method of the determination will be described in the following. First, at a time of waferless dry cleaning performed between plasma processes of a wafer W (hereinafter referred to as a "process"), the OES 130 monitors light emission intensity If of fluorine radicals, and light emission intensity Io of oxygen radicals. The controller 100 calculates a wastage rate of the adhesive using the light emission intensity If of fluorine radicals and the light emission intensity Io of oxygen radicals that are obtained by the OES 130.

Figure 6:
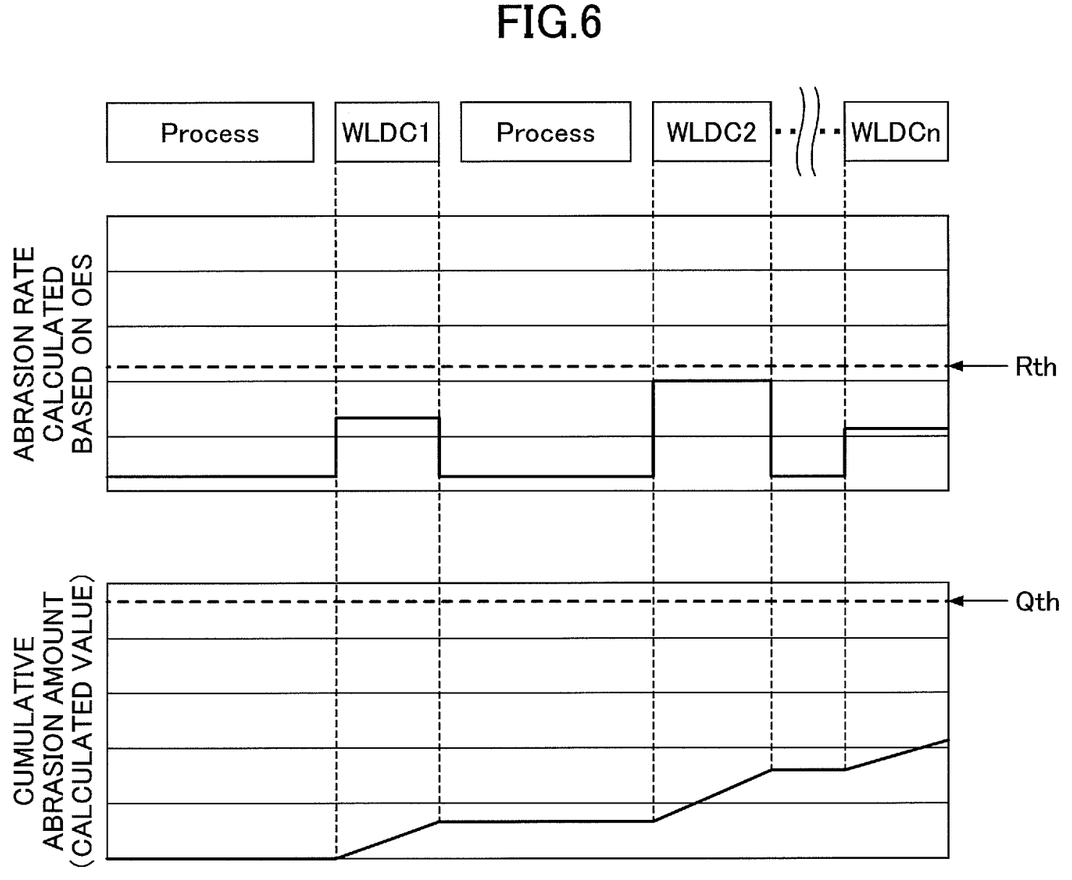
FIG. 6 is a diagram illustrating an example of a calculated wastage rate and a cumulative amount of wastage according to the embodiment.

An example of the calculated wastage rate is illustrated in an upper part of FIG. 6. In the example of FIG. 6, at each of the waferless dry cleanings WLDC1, WLDC2, . . . and WLDCn performed between the processes, a wastage rate is calculated.

A lower part of FIG. 6 illustrates an example of an amount of wastage calculated from the wastage rate illustrated in the upper part. The amount of wastage is a sum of amounts of wastage each obtained by multiplying, for each waferless dry cleaning, the wastage rate calculated from the detection results of the OES 130 by a period of time required for the corresponding waferless dry cleaning. In the present embodiment, the amount of wastage of a particular expendable part is in accordance with a processing time of the waferless dry cleaning, but not limited thereto. That is, an amount of wastage may be a cumulative value of a product of the calculated wastage rate and a processing time of a process involving oxygen gas and fluorine-based gas (e.g., dry cleaning process, etching, film deposition process, etc.) other than waferless dry cleaning.

As illustrated in the lower part of FIG. 6, when the calculated wastage amount reaches or exceeds a first threshold value Qth, an alarm may be output to prompt an operator to perform replacement of parts, maintenance, and the like. An alarm may be output to notify the operator that the next lot after a lot in which the alarm is output cannot be loaded.

Note that the first threshold Qth is an example of a wastage limit, and the first threshold Qth may be preset for each expendable part to be monitored. An alarm may be output when the calculated amount of wastage becomes close to the first threshold Qth.

According to the method described above, by outputting an alarm before wastage of an expendable part progresses and a defective product is manufactured, replacement or maintenance of the electrostatic chuck will be performed. Thus, a product yield rate can be increased.

First Example

[Wastage Determination Process]

Figure 7:
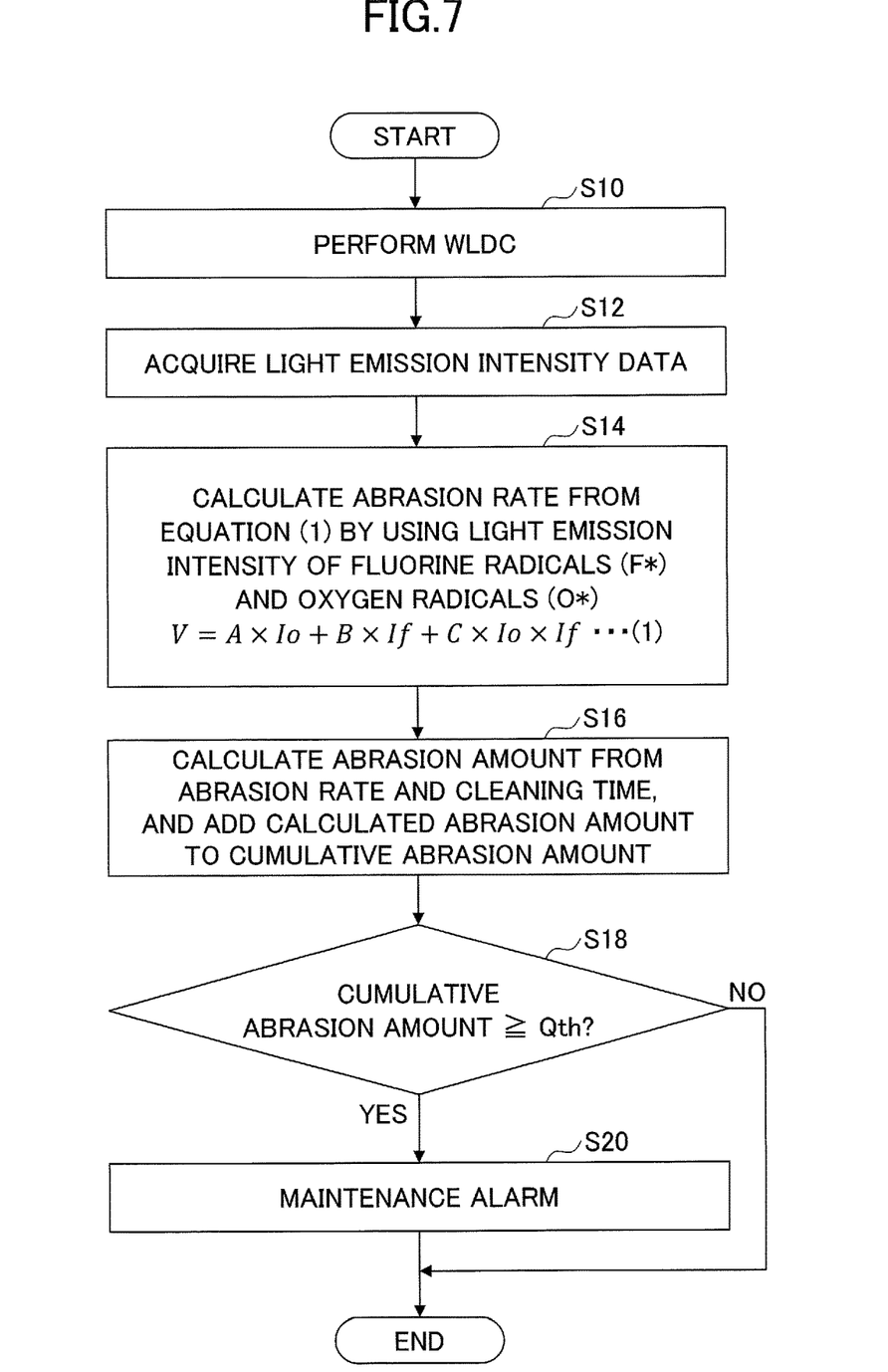
FIG. 7 is a flowchart illustrating an example of a wastage determination process according to a first example.

Next, an example of the wastage determination process according to a first example will be described with reference to a flowchart of FIG. 7. This process is performed by the controller 100. Also, in the first example, this process is performed at a time of waferless dry cleaning after a wafer W is unloaded.

When the process is started, the controller 100 performs the waferless dry cleaning process (step S10). Next, the controller 100 acquires light emission intensity Io of oxygen radicals (O*) and light emission intensity If of fluorine radicals (F*) from the OES 130 (step S12).

Next, the controller 100 substitutes the acquired light emission intensity Io of the oxygen radicals and the acquired light emission intensity If of the fluorine radicals into Equation (1) to calculate the wastage rate (step S14). Next, the controller 100 calculates a wastage amount by multiplying the calculated wastage rate by a processing time of the waferless dry cleaning, and adds the calculated wastage amount to a cumulative wastage amount (sum of wastage amounts having been calculated so far) (step S16).

Next, the controller 100 determines whether or not the cumulative wastage amount is equal to or larger than the first threshold value Qth (step S18). If it is determined that the cumulative wastage amount is equal to or larger than the first threshold value Qth, the controller 100 outputs a maintenance alarm (step S20), and terminates the process. In contrast, if it is determined that the cumulative wastage amount is less than the first threshold value Qth, the controller 100 terminates the process as is.

According to the wastage determination method of the first example, it is possible to determine a degree of wastage of a particular expendable part in the processing chamber by calculating an amount of wastage in real time based on light emission intensity measured by the OES 130, without inhibiting processes of a production wafer. Accordingly, by outputting an alarm such as a maintenance alarm before a defective product is manufactured, replacement of the electrostatic chuck and maintenance can be prompted, generation of a defective product can be suppressed, and a product yield rate can be increased.

Second Example

[Wastage Determination Process]

Figure 8:
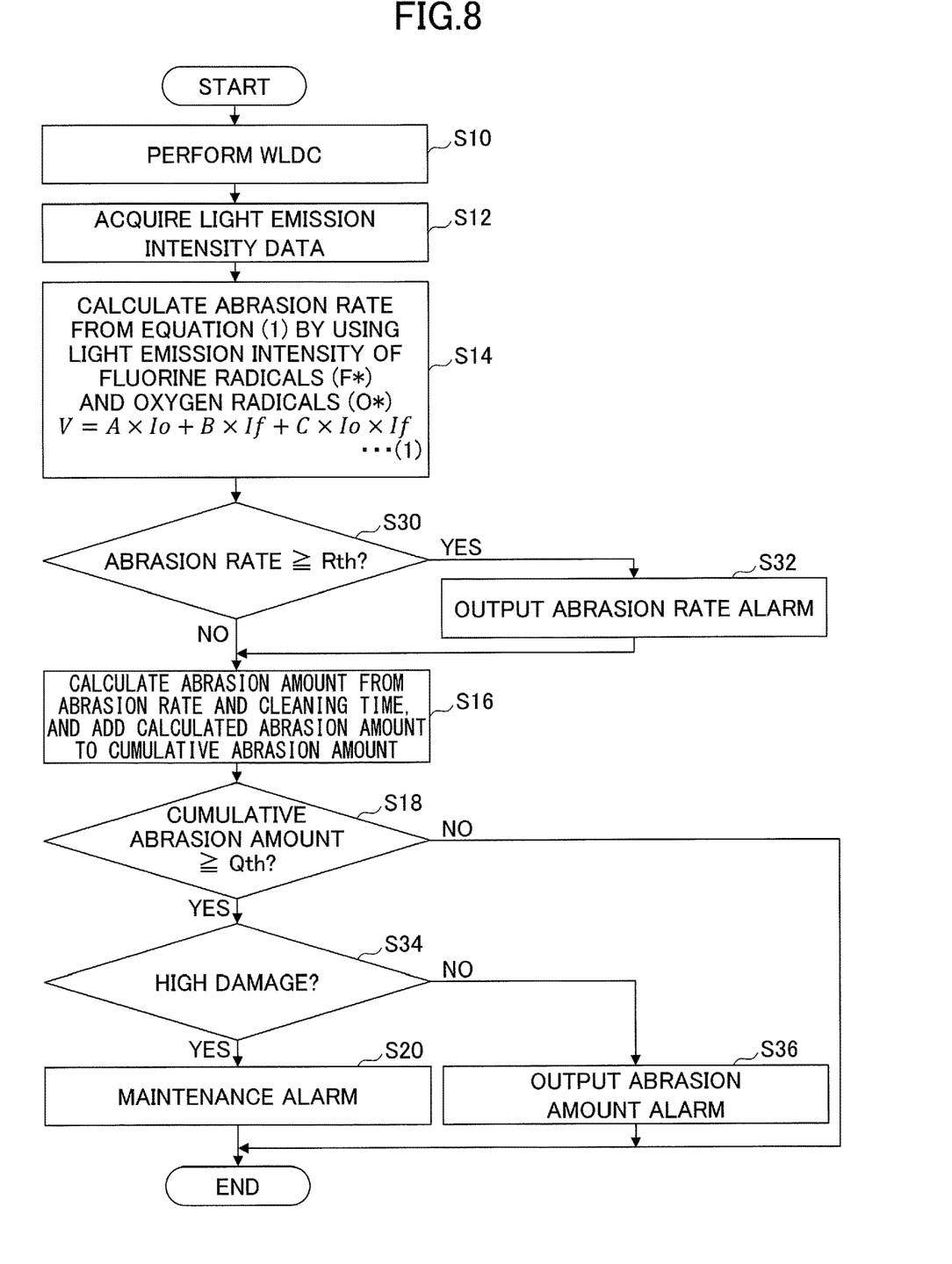
FIG. 8 is a flowchart illustrating an example of a wastage determination process according to a second example.

Next, an example of the wastage determination process according to a second example will be described with reference to a flowchart of FIG. 8. This process is performed by the controller 100. Also, this process is performed at the time of waferless dry cleaning after the wafer W is unloaded.

In the wastage determination process according to the second example, compared to the wastage determination process according to the first example, the maintenance alarm is output using a result of comparison of the wastage rate with a second threshold value Rth, in addition to using a result of comparison of the cumulative wastage amount with the first threshold value Qth. The second threshold value Rth, which is illustrated in the upper part of FIG. 6, is an example of a wastage limit, and may be preset for each expendable part to be monitored. An alarm may be output when the calculated wastage rate becomes the second threshold value Rth or larger, or when the calculated wastage rate becomes closer to the second threshold value Rth.

When the process is started, the controller 100 performs the waferless dry cleaning process (step S10). Next, the controller 100 acquires light emission intensity Io of oxygen radicals and light emission intensity If of fluorine radicals from the OES 130 (step S12).

Next, the controller 100 substitutes the acquired light emission intensity Io of the oxygen radicals and the acquired light emission intensity If of the fluorine radicals into Equation (1) to calculate the wastage rate (step S14). Next, the controller 100 determines whether or not the calculated wastage rate is equal to or larger than the second threshold value Rth (step S30). If it is determined that the calculated wastage rate is equal to or larger than the second threshold value Rth, the controller 100 outputs an alarm of the wastage rate (step S32), and the process proceeds to step S16. However, execution of step S32 may be omitted.

In contrast, if it is determined that the calculated wastage rate is less than the second threshold value Rth, the process proceeds to step S16 immediately. At step S16, the controller 100 calculates wastage amount by multiplying the calculated wastage rate by a processing time of the waferless dry cleaning, and adds the calculated wastage amount to a cumulative wastage amount (step S16).

Next, the controller 100 determines whether or not the cumulative wastage amount is equal to or larger than the first threshold value Qth (step S18). If it is determined that the cumulative wastage amount is equal to or larger than the first threshold value Qth, the controller 100 determines whether or not damage intensity is high (step S34). As an example of determining whether or not the damage intensity is high, it may be determined that the damage intensity is high in a case in which the wastage rate is equal to or larger than the second threshold value Rth and in which the cumulative wastage amount is equal to or larger than the first threshold value Qth.

If it is determined that the damage intensity is high, the controller 100 outputs a maintenance alarm (step S20), and terminates the process. If it is determined that the damage intensity is not high, the controller 100 outputs an alarm of the wastage amount (step S36), and terminates the process. However, execution of step S36 may be omitted.

According to the wastage determination method of the second example, based on a result of comparison of the calculated wastage amount with the first threshold value Qth and a result of comparison of the calculated wastage rate with the second threshold value Rth, degree of wastage of a particular expendable part can be determined.

According to the wastage determination method of the second example similarly, it is possible to determine the degree of wastage of a particular expendable part in the processing chamber by calculating the amount of wastage in real time based on the light emission intensity measured by the OES 130. Therefore, by outputting an alarm such as a maintenance alarm before a defective product is manufactured, replacement of the electrostatic chuck and maintenance can be prompted, generation of defective products can be reduced, and a product yield rate can be increased.

In detecting an endpoint of plasma processing, a time for waferless dry cleaning and the like may often vary depending on a sample structure and the like. With respect to the above, according to the wastage determination method of the present embodiment, because an amount of wastage is calculated in real time based on light emission intensity measured by the OES 130 without inhibiting the process, a wastage state can be accurately recognized. Therefore, by outputting an alarm before a defective product is manufactured, replacement of the electrostatic chuck and maintenance can be performed, and a product yield rate can be increased.

Although the wastage determination method and the plasma processing apparatus have been described in accordance with the above-described embodiments, the wastage determination method and the plasma processing apparatus according to the present invention are not limited to the above-described embodiments, and various modifications and enhancements can be made within the scope of the present invention. Matters described in the above-described embodiments may be combined to the extent that they are consistent.

For example, the controller 100 calculates all of the wastage rate during cleaning, the wastage rate during etching, and the wastage rate during deposition using Equation (1). However, with respect to the wastage rate V, a wastage rate V1 at a time of cleaning, a wastage rate V2 at a time of etching, and a wastage rate V3 at a time of deposition may be calculated separately. In this case, coefficients A, B, and C of Equation (1) for calculating the wastage rate V1 for cleaning are learned to reflect a degree of wastage of a member during cleaning. Similarly, coefficients A, B, and C of Equation (1) for calculating the wastage rate V2 for etching are learned to reflect a degree of wastage of a member during etching. Furthermore, coefficients A, B, and C of Equation (1) for calculating the wastage rate V3 for deposition are learned to reflect a degree of wastage of a member during deposition.

The present invention is applicable not only to a parallel-flat plate type dual-frequency apparatus illustrated in FIG. 1, but also to other types of plasma processing apparatuses. Examples of other types of plasma processing apparatuses may include a capacitively coupled plasma (CCP) type processing apparatus, an inductively coupled plasma (ICP) type processing apparatus, a plasma processing apparatus using a radial line slot antenna, a helicon wave plasma (HWP) type processing apparatus, an electron cyclotron resonance plasma (ECR) type processing apparatus, and a surface wave plasma processing apparatus.

Further, although the semiconductor wafer W has been described herein as a substrate to be etched, it is not limited thereto. Examples of a substrate to be etched may include various substrates used in an LCD (Liquid Crystal Display), an FPD (Flat Panel Display), and the like, a photomask, a CD substrate, and a printed circuit board.

What is claimed is:
1. A plasma processing apparatus comprising:
   a chamber;
   a gas inlet for supplying a first gas and a second gas into the chamber, the first gas containing fluorine;
   a plasma generator configured to generate a plasma from the first gas and the second gas supplied into the chamber;
   an optical emission spectrometer (OES) configured to measure light emission intensities of first radicals and second radicals in the plasma, the first radicals originating from the first gas, the second radicals originating from the second gas;
   an expendable part disposed in the chamber; and
   a processor configured to determine a wastage rate of the expendable part based on the measured light emission intensities of the first radicals and the second radicals.
2. The plasma processing apparatus according to claim 1, wherein the second gas contains oxygen.

3. The plasma processing apparatus according to claim 1, wherein the processor is configured to determine the wastage rate of the expendable part based on the measured light emission intensities of the first radicals and the second radicals, and based on stored data including a relation between light emission intensities of the first radicals and the second radicals and a wastage rate of the expendable part.

4. The plasma processing apparatus according to claim 1, wherein the wastage rate of the expendable part is calculated by Equation (1):

$$V = A \times Io + B \times If + C \times Io \times If \qquad (1)$$

wherein V is the wastage rate of the expendable part, Io is light emission intensity of the first radicals measured by the OES, If is light emission intensity of the second radicals measured by the OES, and A, B, and C are coefficients.

5. The plasma processing apparatus according to claim 1, wherein the processor is configured to
determine an amount of wastage of the expendable part from the determined wastage rate; and
determine a degree of wastage of the expendable part based on a comparison between the determined amount of wastage and a first threshold.

6. The plasma processing apparatus according to claim 1, wherein the processor is configured to
determine an amount of wastage of the expendable part based on the determined wastage rate; and
determine a degree of wastage of the expendable part based on a comparison between the determined amount of wastage and a first threshold, and based on a comparison between the determined wastage rate and a second threshold.

7. The plasma processing apparatus according to claim 5, wherein the amount of wastage is a cumulative value of a product of the determined wastage rate and a plasma generating time.

8. The plasma processing apparatus according to claim 1, wherein the expendable part is an adhesive used in the chamber.

9. The plasma processing apparatus according to claim 8, wherein the adhesive includes any one selected from a group consisting of acrylic material, epoxy resinous material, and silicon based material.

10. The plasma processing apparatus according to claim 1, wherein the first gas is any one selected from a group consisting of $CF_4$, $NF_3$, and $SF_6$.

11. A system for determining a wastage rate of an expendable part disposed in a plasma processing chamber, comprising:
an optical emission spectrometer (OES) configured to measure light emission intensities of first radicals and second radicals in a plasma generated in the plasma processing chamber, the first radicals originating from a first gas, the second radicals originating from a second gas, the first gas containing fluorine; and
a processor configured to determine a wastage rate of the expendable part based on the measured light emission intensities of the first radicals and the second radicals.

12. The system according to claim 11, wherein the second gas contains oxygen.

13. The system according to claim 11, wherein the processor is configured to determine the wastage rate of the expendable part based on the measured light emission intensities of the first radicals and the second radicals, and based on stored data including a relation between light emission intensities of the first radicals and the second radicals and a wastage rate of the expendable part.

14. The system according to claim 11, wherein the expendable part is an adhesive used in the plasma processing chamber.

15. The system according to claim 14, wherein the adhesive includes any one selected from a group consisting of acrylic material, epoxy resinous material, and silicon based material.

16. The system according to claim 11, wherein the first gas is any one selected from a group consisting of $CF_4$, $NF_3$, and $SF_6$.

* * * * *